United States Patent [19]

Tsuboi

[11] Patent Number: 5,726,098
[45] Date of Patent: Mar. 10, 1998

[54] METHOD OF MANUFACTURING SEMICONDUCTOR DEVICE HAVING MULTILEVEL INTERCONNECTION

[75] Inventor: Atsushi Tsuboi, Tokyo, Japan

[73] Assignee: NEC Corporation, Japan

[21] Appl. No.: 531,376

[22] Filed: Sep. 21, 1995

[30] Foreign Application Priority Data

Sep. 22, 1994 [JP] Japan .................... 6-227817

[51] Int. Cl.⁶ .................... H01L 21/283; H01L 21/31
[52] U.S. Cl. .................... 438/622; 438/629; 438/638; 438/648; 438/672
[58] Field of Search .................... 438/622, 629, 438/638, 648, 672, 637, 669, 355, 633

[56] References Cited

U.S. PATENT DOCUMENTS

| | | | |
|---|---|---|---|
| 4,619,037 | 10/1986 | Taguchi et al. | 438/637 |
| 4,874,719 | 10/1989 | Kurosawa | 438/637 |
| 4,900,695 | 2/1990 | Takahashi et al. | 438/637 |
| 4,948,756 | 8/1990 | Ueda | 438/622 |
| 5,204,286 | 4/1993 | Doan | 438/672 |
| 5,545,584 | 8/1996 | Wuu et al. | 438/620 |

*Primary Examiner*—T. N. Quach
*Attorney, Agent, or Firm*—Hayes, Soloway, Hennessey, Grossman & Hage, P.C.

[57] ABSTRACT

An underlying interconnection is formed on a semiconductor substrate, and an interlayer insulating film is formed on the semiconductor substrate and the underlying interconnection. A metal film is deposited on the interlayer insulating film, and is patterned in an interconnection pattern, and a first opening for connecting the metal film to the underlying interconnection is patterned, thereby forming an overlying interconnection. Then, a protection film is formed so as to cover the surfaces of the overlying interconnection and the interlayer insulating film. Next, a photoresist film is formed on the protection film, and is patterned to provide a second opening larger than the first opening in the protection film above the first opening and provide a third opening in a pad-portion forming region on the overlying interconnection. At the same time, with the overlying interconnection as a mask, the interlayer insulating film is selectively etched out to form a through hole. Then, a tungsten film is deposited in the through hole and on the protection film, and the unnecessary portion of the tungsten film is etched back to form a tungsten plug in the through hole which electrically connects the underlying interconnection to the overlying interconnection.

6 Claims, 4 Drawing Sheets

5,726,098

METHOD OF MANUFACTURING SEMICONDUCTOR DEVICE HAVING MULTILEVEL INTERCONNECTION

BACKGROUND OF THE INVENTION

1. Field of the Invention

The present invention relates to a method of manufacturing a semiconductor device having a multilevel interconnection.

2. Description of the Related Art

Recently, the interconnection of a semiconductor device has a multilevel structure and its pattern becomes finer. With this trend, the structure in which a through hole is provided in the interlayer insulating film of a semiconductor device, a metal plug is buried in this through hole and the upper and lower interconnections are connected via this metal plug has been employed.

FIG. 1 is a plan view showing a conventional semiconductor device, FIG. 2A is a cross-sectional view taken along the line X-X' in FIG. 1, and FIGS. 2A through 2D are cross-sectional views showing a step-by-step conventional semiconductor-device manufacturing method.

First, as shown in FIGS. 1 and 2A, an insulating film 2 is formed on a substrate 1 of Si, a metal film of aluminum or the like is formed on this insulating film 2, and the resultant structure is then patterned to form underlying interconnections 3a and 3b. Then, a silicon oxide film is deposited about 2 μm thick by plasma CVD so as to cover the underlying interconnections 3a, 3b and the insulating film 2. Next, the top surface of this silicon oxide film is smoothed by CMP (Chemical-Mechanical Polishing), thus forming an interlayer insulating film 4 with a thickness of approximately 1 μm. Then, an overlying interconnection 6 of aluminum or the like is selectively formed on the interlayer insulating film 4.

In this semiconductor device, a part of the overlying interconnection 6 is so formed as to overlap a part of the underlying interconnection 3a in a plan view as shown in FIG. 1.

Next, a photoresist film 11 is coated on the surface of the overlying interconnection 6 and the interlayer insulating film 4, and a through-hole forming pattern is formed on this photoresist film 11, as shown in FIG. 2B. With the photoresist film 11 as a mask, the overlying interconnection 6 and the interlayer insulating film 4 are sequentially subjected to anisotropic etching, forming a through hole 12 of about 0.9 μm in diameter.

The photoresist film 11 is then removed and a tungsten film is deposited on the surface of the overlying interconnection 6, etc. by the blanket tungsten growing scheme in such a way as to bury the through hole 12, as shown in FIG. 2C. Then, the tungsten film is etched back to leave the tungsten film only in the through hole 12, thereby forming a tungsten plug 13.

Then, a protection film 14 is deposited on the surfaces of the tungsten plug 13, the overlying interconnection 6 and the interlayer insulating film 4, as shown in FIG. 2D. The protection film 14 on the overlying interconnection 6 is selectively etched, forming a pad portion (not shown).

The conventional semiconductor device is fabricated in the above-described manner. According to this conventional manufacturing method, as mentioned above, the through hole 12 is formed by sequentially performing anisotropic etching on the overlying interconnection 6 and the underlying interlayer insulating film 4.

This conventional method however uses a metal-film etching gas to etch the overlying interconnection 6 made of aluminum or the like and uses an insulating-film etching gas to etch the interlayer insulating film 4 made of silicon oxide. This method therefore should change the etching gases, thus complicating the etching process. Further, the photolithography process for patterning the protection film 14 is needed only to form the pad portion, making the process of fabricating the semiconductor device troublesome.

SUMMARY OF THE INVENTION

Accordingly, it is an object of the present invention to provide a method of manufacturing a semiconductor device with a multilevel interconnection which employs an improved etching process to form a through hole and an improved photolithography process to form a pad portion, thereby simplifying the overall fabrication.

A method of manufacturing a semiconductor device with a multilevel interconnection according to this invention comprises: a first step of forming an underlying interconnection on a semiconductor substrate; a second step of forming an interlayer insulating film on the semiconductor substrate and the underlying interconnection; a third step of depositing a metal film on the interlayer insulating film in an interconnection pattern, and patterning a first opening for connecting the metal film to the underlying interconnection, thereby forming an overlying interconnection; a fourth step of forming a protection film so as to cover surfaces of the overlying interconnection and the interlayer insulating film; a fifth step of forming a photoresist film on the protection film, and patterning the photoresist film to provide a second opening larger than the first opening in the protection film above the first opening and provide a third opening in a pad-portion forming region on the overlying interconnection; a sixth step of forming the second opening and the third opening in the protection film with the photoresist film used as a mask, and selectively etching out the interlayer insulating film with the overlying interconnection as a mask, thereby forming a through hole; a seventh step of removing the photoresist film; and an eighth step of depositing a tungsten film in a through hole and on the protection film, and etching back the tungsten film on the protection film, forming a tungsten plug in the through hole which electrically connects the underlying interconnection to the overlying interconnection.

At least one of the underlying interconnection and the overlying interconnection may be formed by a multilevel film of TiN/Al—Si—Cu/TiN/Ti.

The protection film may be formed of plasma SiON.

The interlayer insulating film may be formed by a silicon oxide film of plasma TEOS (Tetra-Ethyl-Ortho-Silicate).

This method may further comprise a step of smoothing a top surface of the interlayer insulating film by CMP between the second step and the third step.

This method may further comprise a step of forming an insulating film on the semiconductor substrate prior to the first step.

The method of manufacturing a semiconductor device according to this invention can successively etch the protection film for protecting the overlying interconnection and the interlayer insulating film formed between the overlying interconnection and the underlying interconnection using the same etching gas, thus eliminating the need for the exchange of the etching gases.

Further, the third opening for forming the pad portion can be formed at the same time as the second opening for the through hole is provided in the protection film, thus eliminating the need for the photolithography process that was conventionally needed to form the pad portion. This approach can further simplify the process of manufacturing a semiconductor device.

DETAILED DESCRIPTION OF THE PREFERRED EMBODIMENT

A preferred embodiment of the present invention will now be described referring to the accompanying drawings.

Figure 1:
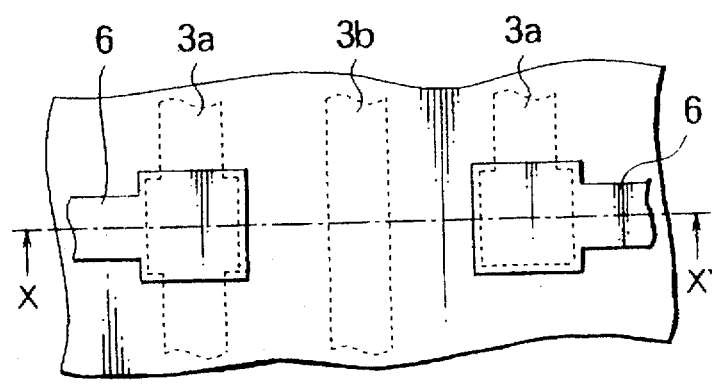
FIG. 1 is a plan view showing a conventional semiconductor device.
Figure 2A:
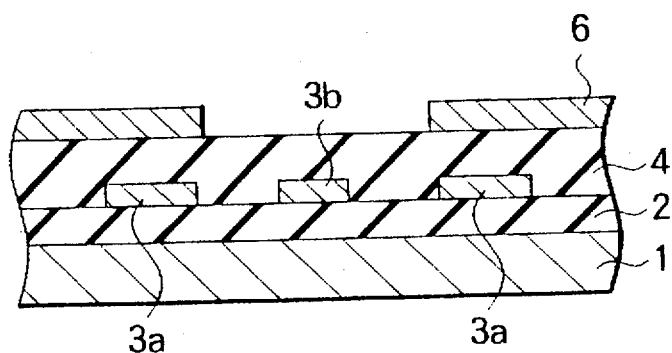
FIG. 2A is a cross-sectional view taken along the line X-X' in FIG. 1, and FIGS. 2A through 2D are cross-sectional views showing a step-by-step conventional semiconductor-device manufacturing method.
Figure 2B:
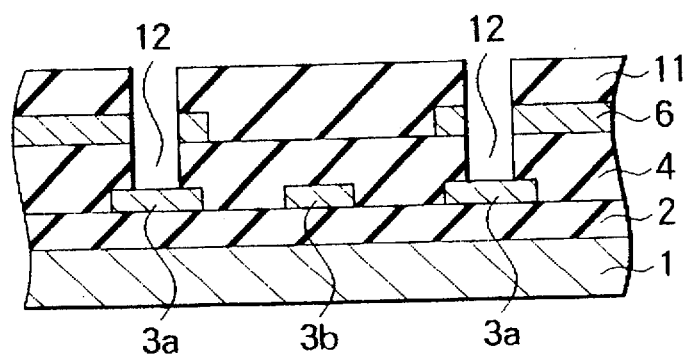
Figure 2C:
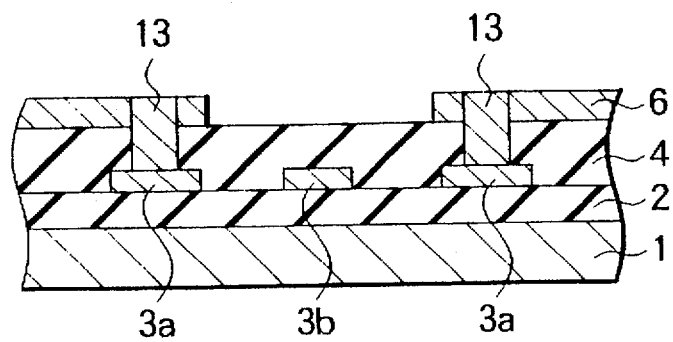
Figure 2D:
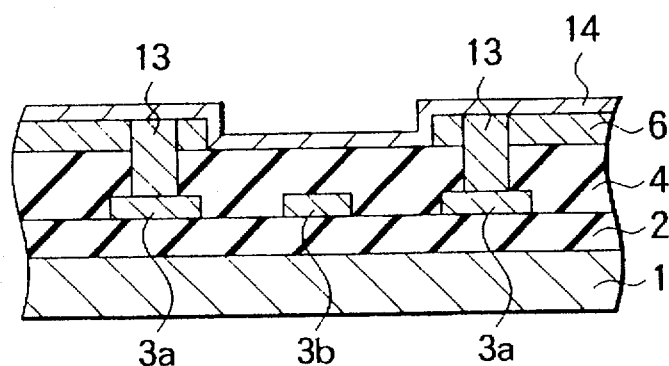
Figure 3:
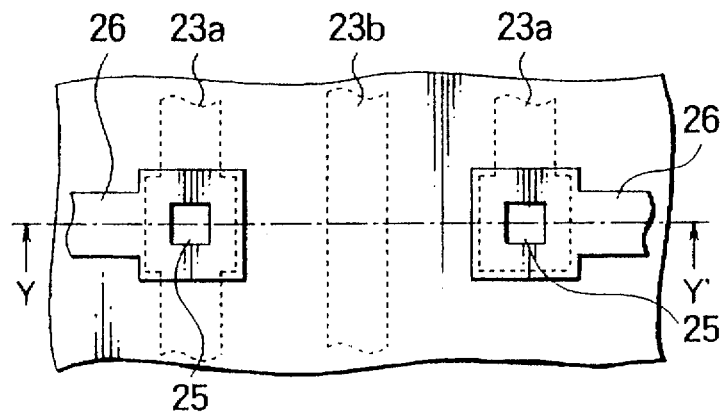
FIG. 3 is a plan view showing an embodiment of a semiconductor device according to this invention.
Figure 4A:
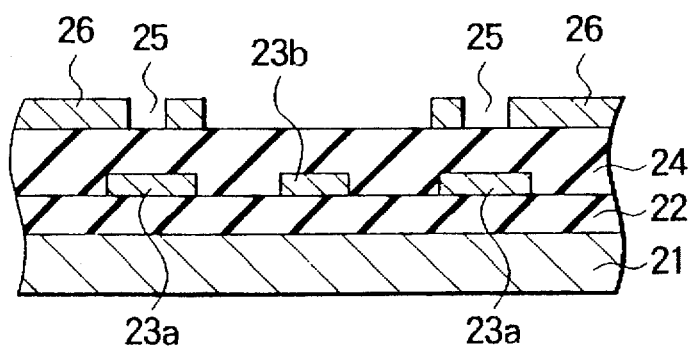
FIGS. 4A through 4D are cross-sectional views showing a step-by-step method of manufacturing the semiconductor device, FIG. 4A being a cross-sectional view taken along the line Y-Y' in FIG. 3.

FIG. 3 presents a plan view showing an embodiment of a semiconductor device according to this invention, and FIGS. 4A through 4D are cross-sectional views showing a step-by-step method of manufacturing the semiconductor device. FIG. 4A is a cross-sectional view taken along the line Y-Y' in FIG. 3.

First, as shown in FIGS. 3 and 4A, an insulating film 22 is formed on a substrate 21 of Si and a Ti film with a thickness of, for example, about 60 nm is formed on the insulating film 22 by sputtering. Then, metal films, namely a TiN film, Al—Si—Cu film and TiN film, are deposited, for example, 100 nm, 400 nm and 50 nm thick, respectively, in the named order. Those metal films are patterned in an interconnection pattern, thereby forming underlying interconnections 23a and 23b having a multilevel structure of TiN/Al—Si—Cu/Tin/Ti. Next, a silicon oxide film is deposited about 2 μm thick on the surfaces of the underlying interconnections 23a and 23b and the insulating film 22 by plasma TEOS (Tetra-Ethyl-Ortho-Silicate) so as to cover them. Then, the top surface of the silicon oxide film is smoothed by CMP, forming an interlayer insulating film 24 with a thickness of about 1 μm. Then, metal films, namely a Ti film, a TiN film, Al—Si—Cu film and TiN film, like the metal films of the underlying interconnection, are deposited, for example, 30 nm, 100 nm, 900 nm and 50 nm thick, respectively, on the interlayer insulating film 24 in the named order. Those metal films are patterned to have the desired interconnection pattern, and a first opening 25 is provided for the electric connection to the underlying interconnection 23a, thus selectively forming an overlying interconnection 26.

At this time, the first opening 25 is formed in the portion where the underlying interconnection 23a and the overlying interconnection 26 overlap in a plan view, and has a size of, for example, about 0.9 μm on each side.

Figure 4B:
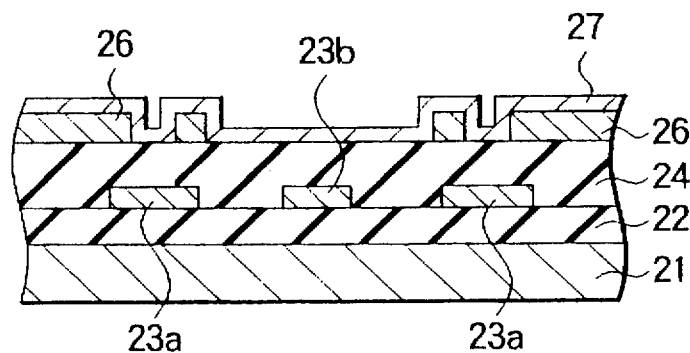
Figure 4C:
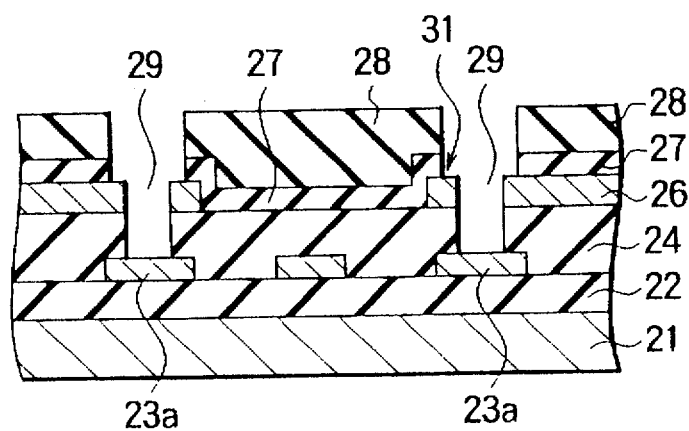

Then, as shown in FIG. 4B, a protection film 27 is formed about 1.0 μm thick by plasma SiON (silicon oxide nitrate) so as to cover the surfaces of the overlying interconnection 26 and the interlayer insulating film 24.

next, a photoresist film 28 is formed on the protection film 27 as shown in FIG. 4C. At this time, the photoresist film 28 is patterned so as to form a second opening 31, slightly larger in vertical and horizontal widths than the first opening in the overlying interconnection 26, and a third opening (not shown) in a pad-forming region on the overlying interconnection 26. With the photoresist film 28 of the predetermined shape used as a mask, the portion of the protection film 27 which becomes the second opening 31 and the portion of the protection film 27 which becomes the third opening are etched out to expose a pad portion to be formed in the overlying interconnection 26. In this manner, the second opening for a through hole and the pad portion are formed at a time. This step of etching out the protection film 27 can successively etch out the interlayer insulating film 24 using the overlying interconnection 26 as a mask. As a result, a through hole 29 for connecting the underlying interconnection 23a to the overlying interconnection 26 is formed.

Figure 4D:
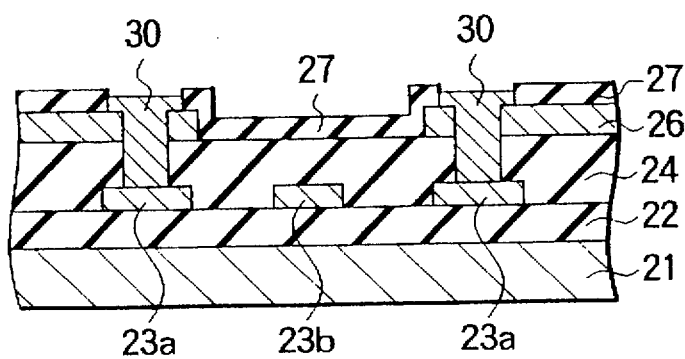

Then, as shown in FIG. 4D, the photoresist film 28 is removed, and a tungsten film is deposited on the surface of the protection film 27 by the blanket tungsten film growing scheme in such a manner as to bury the through hole 29. Then, this tungsten film is etched back to leave the tungsten film only in the through hole 12, thereby forming a tungsten plug 30.

According to this embodiment, although the surface of the tungsten plug is not covered with the protection film 27, the overlying interconnection 26 is completely covered with the tungsten film, so that the reliability of the semiconductor device is not impaired.

According to the method of this embodiment, the protection film 27 and the interlayer insulating film 24 can successively etched with the same etching gas, thus eliminating the need for the exchange of the etching gases.

Further, the second opening 31 for the through hole and the third opening for forming the pad portion can be formed simultaneously in the protection film 27. This method therefore requires no photolithography process only for forming the pad portion, and can thus simplify the process of manufacturing a semiconductor device.

What is claimed is:

1. A method of manufacturing a semiconductor device with a multilevel interconnection comprising:

a first step of forming an underlying interconnection on a semiconductor substrate;

a second step of forming an interlayer insulating film on said semiconductor substrate and said underlying interconnection;

a third step of depositing a metal film on said interlayer insulating film in an interconnection pattern, and patterning a first opening for connecting said metal film to said underlying interconnection, thereby forming an overlying interconnection;

a fourth step of forming a protection film so as to cover surfaces of said overlying interconnection and said interlayer insulating film;

a fifth step of forming a photoresist film on said protection film, and patterning said photoresist film to provide a second opening larger than said first opening in said protection film above said first opening and provide a third opening in a pad-portion forming region on said overlying interconnection;

a sixth step of forming said second opening and said third opening in said protection film with said photoresist film used as a mask, and selectively etching out said interlayer insulating film with said overlying interconnection as a mask, thereby forming a through hole;

a seventh step of removing said photoresist film; and an eighth step of depositing a tungsten film in a through hole and on said protection film, and etching back said tungsten film on said protection film, forming a tungsten plug in said through hole which electrically connects said underlying interconnection to said overlying interconnection.

2. The method according to claim 1, wherein at least one of said underlying interconnection and said overlying interconnection is formed by a multilevel film of TiN/Al—Si—Cu/TiN/Ti.

3. The method according to claim 1, wherein said protection film is formed of plasma SiON.

4. The method according to claim 1, wherein said interlayer insulating film is formed by a silicon oxide film of plasma TEOS (Tetra-Ethyl-Ortho-Silicate).

5. The method according to claim 1, further comprising a step of smoothing a top surface of said interlayer insulating film by CMP between said second step and said third step.

6. The method according to claim 1, further comprising a step of forming an insulating film on said semiconductor substrate prior to said first step.

* * * * *